(12) United States Patent
Harubeppu et al.

(10) Patent No.: US 9,013,877 B2
(45) Date of Patent: Apr. 21, 2015

(54) POWER SEMICONDUCTOR DEVICE

(71) Applicant: Hitachi, Ltd., Chiyoda-ku, Tokyo (JP)

(72) Inventors: Yu Harubeppu, Hitachinaka (JP); Takayuki Kushima, Hitachi (JP); Yasuhiro Nemoto, Hitachi (JP); Keisuke Horiuchi, Mito (JP); Hisashi Tanie, Mito (JP)

(73) Assignee: Hitachi Power Semiconductor Device, Ltd., Hitachi-shi (JP)

( * ) Notice: Subject to any disclaimer, the term of this patent is extended or adjusted under 35 U.S.C. 154(b) by 266 days.

(21) Appl. No.: 13/689,299

(22) Filed: Nov. 29, 2012

(65) Prior Publication Data

US 2013/0135824 A1 May 30, 2013

(30) Foreign Application Priority Data

Nov. 30, 2011 (JP) ................. 2011-261502

(51) Int. Cl.
*H05K 7/20* (2006.01)
*H01L 23/34* (2006.01)
(Continued)

(52) U.S. Cl.
CPC .............. *H01L 23/34* (2013.01); *H01L 23/42* (2013.01); *H01L 2224/48091* (2013.01); *H01L 2224/48137* (2013.01); *H01L 2224/73265* (2013.01); *H01L 2924/19107* (2013.01); *H01L 2924/13055* (2013.01); *H01L 2924/1305* (2013.01)

(58) Field of Classification Search
CPC ......... H05K 7/2089–7/20945; H05K 7/20218; H05K 7/20254; H01L 23/34
USPC ........................ 361/679.46–679.54, 688–723; 174/15.1–15.2, 16.1–16.3, 521, 526, 174/547–548; 257/712–722, E23.088; 165/80.1–80.5, 104.33, 185; 363/16–20, 21.01–21.18, 141–148; 454/184; 312/236

See application file for complete search history.

(56) References Cited

U.S. PATENT DOCUMENTS 7,561,429 B2 * 7/2009 Yahata et al. ................. 361/715
7,635,916 B2 * 12/2009 Jensen et al. ................. 257/704
7,663,886 B2 * 2/2010 Aoki et al. ..................... 361/715

(Continued)

FOREIGN PATENT DOCUMENTS

JP     9-121018 A     5/1997
JP     11-214612 A    8/1999

(Continued)

OTHER PUBLICATIONS

Japanese Office Action with English translation thereof dated Feb. 4, 2014 {Six (6) pages}.

*Primary Examiner* — Michail V Datskovskiy
*Assistant Examiner* — Razmeen Gafur
(74) *Attorney, Agent, or Firm* — Crowell & Moring LLP

(57) ABSTRACT

The purpose of the present invention is to provide a power semiconductor device which has a light weight, high heat dissipation efficiency, and high rigidity. The power semiconductor device including a base 1, semiconductor circuits 2 which are arranged on the base 1, and a cooling fin 3 which cools each of the semiconductor circuits 2, in which one or more protruding portions 1a, 1b are formed on the base 1, widths of the protruding portions 1a, 1b in a direction parallel to the base 1 surface being longer than a thickness of the base 1, thereby providing power semiconductor devices 100, 200, 300, 400 which have a light weight, high heat dissipation efficiency, and high rigidity.

10 Claims, 12 Drawing Sheets

(51) Int. Cl.
*H01L 23/42* (2006.01)
*H01L 23/473* (2006.01)

(56) References Cited

U.S. PATENT DOCUMENTS

| | | | | |
|---|---|---|---|---|
| 7,839,641 B2 * | 11/2010 | Baba et al. | ................... | 361/711 |
| 8,026,597 B2 * | 9/2011 | Brandenburg et al. | ....... | 257/714 |
| 8,324,720 B2 * | 12/2012 | Schulz | ................... | 257/691 |
| 8,520,389 B2 * | 8/2013 | Rozman et al. | ............ | 361/709 |
| 8,593,817 B2 * | 11/2013 | Bayerer et al. | ............ | 361/729 |
| 8,637,979 B2 * | 1/2014 | Miyamoto | ................... | 257/712 |
| 8,653,651 B2 * | 2/2014 | Uchida et al. | ................. | 257/718 |
| 2002/0180037 A1 * | 12/2002 | Shirakawa et al. | ........... | 257/727 |
| 2003/0198022 A1 * | 10/2003 | Ye et al. | ................... | 361/719 |
| 2004/0159934 A1 * | 8/2004 | North et al. | ................... | 257/707 |
| 2008/0023826 A1 * | 1/2008 | Takagi | ................... | 257/727 |
| 2008/0230210 A1 * | 9/2008 | Bhatti et al. | ............. | 165/104.33 |
| 2009/0283902 A1 * | 11/2009 | Bezama et al. | ................ | 257/713 |
| 2009/0321924 A1 * | 12/2009 | Funakoshi et al. | ............ | 257/722 |
| 2010/0127371 A1 * | 5/2010 | Tschirbs | ................... | 257/684 |
| 2010/0295172 A1 * | 11/2010 | Gao et al. | ................... | 257/712 |
| 2011/0198662 A1 * | 8/2011 | Lin et al. | ................... | 257/99 |

FOREIGN PATENT DOCUMENTS

| | | |
|---|---|---|
| JP | 2002-325467 A | 11/2002 |
| JP | 2003-332500 A | 11/2003 |
| JP | 2004-335725 A | 11/2004 |
| JP | 2009-26957 A | 2/2009 |
| JP | 2010-27735 A | 2/2010 |
| JP | 2011-155207 A | 8/2011 |

* cited by examiner

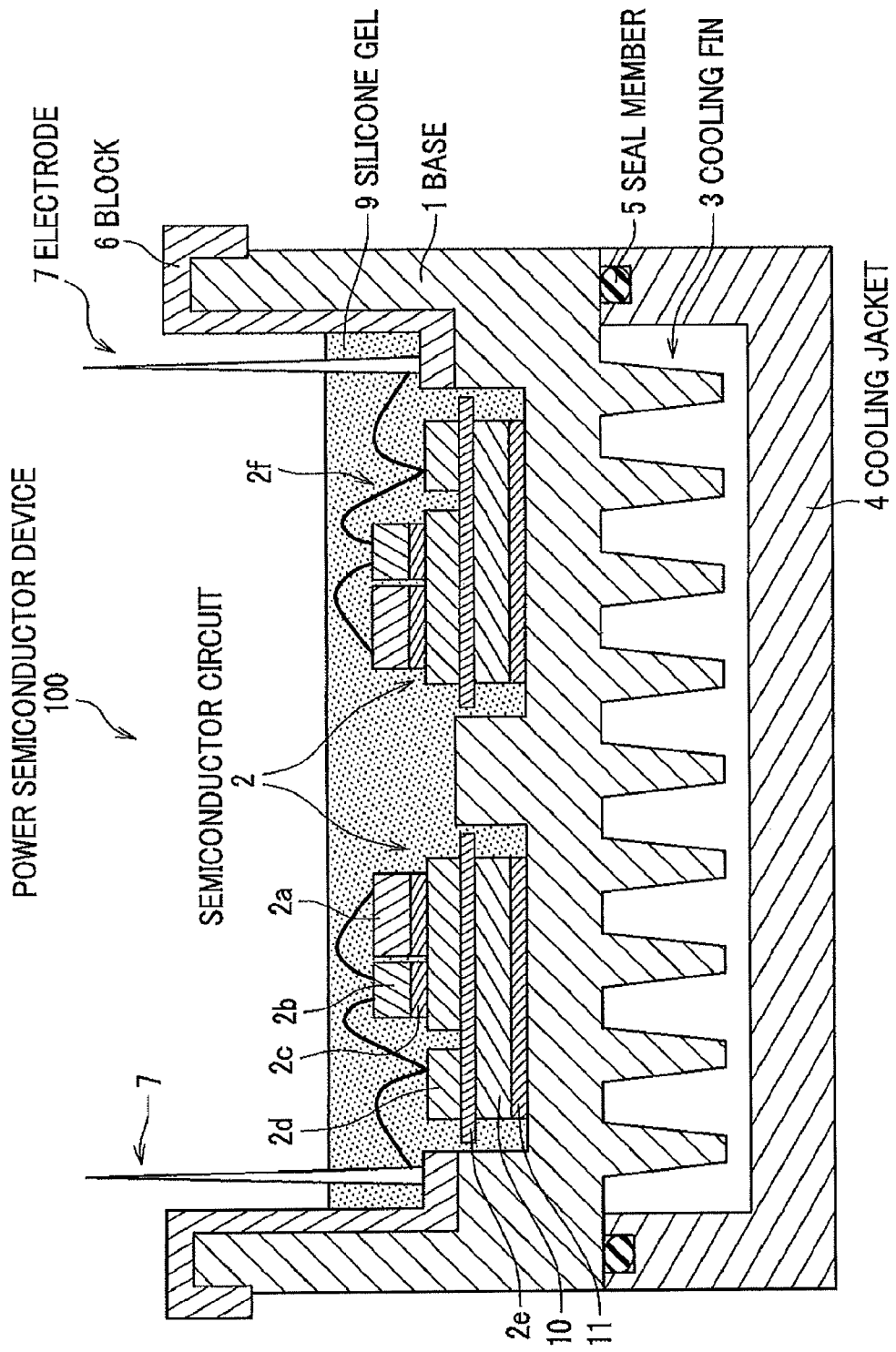

POWER SEMICONDUCTOR DEVICE

TECHNICAL FIELD

The present invention relates to a power semiconductor device.

BACKGROUND ART

There have been used more and more semiconductor devices including semiconductor circuits. In particular, a power semiconductor device including a power semiconductor circuit is used for controlling electrical apparatus such as high output motors and generators, and for power conversion. Such a power semiconductor device is, for example, an IGBT (Insulated Gate Bipolar Transistor).

In recent years, the demand for power semiconductor devices installed in power control apparatus mounted on ships, trains, and automobiles such as electrical vehicles and hybrid electrical vehicles has been increased. Therefore, requests for reducing weight as automotive members as well as for increasing efficiency and capacity as electrical appliances have been increased for the power semiconductor devices. To meet such requests, technologies for providing a lightweight power semiconductor device have been known in Patent Documents 1 to 4.

CITATION LIST

Patent Literature

{Patent Document 1}
Japanese Patent Application Publication No. 2009-026957
{Patent Document 2}
Japanese Patent Application Publication No. H11-214612
{Patent Document 3}
Japanese Patent Application Publication No. 2010-027735
{Patent Document 4}
Japanese Patent Application Publication No. H09-121018

SUMMARY OF INVENTION

Technical Problem

One way to obtain a lightweight power semiconductor device is to reduce a thickness of a base (substrate) constituting the power semiconductor device. However, there is a possibility to cause a problem on the strength of the base when the base is merely thinned.

In addition, since a temperature of the power semiconductor device usually becomes high during operation, heat dissipation is important. In particular, the larger a current flowing through the power semiconductor device is, the larger the amount of heat is generated. Therefore, in the semiconductor with a large current flowing therein, it is particularly important to efficiently discharge the generated heat to the outside.

As a base material, a metal material is usually used. The metal is expanded in some cases by the heat generated from the semiconductor device. Therefore, connection portions such as a solder to fix the base to individual members may crack by fatigue through expanding and shrinking of the base. As a consequence, the connection portions of the semiconductor device may easily be damaged, and it is difficult to use the semiconductor device for a long period of time in some cases. This means that a lifetime of the power semiconductor device becomes short.

The present invention is devised in view of the above problems. A purpose of the present invention is to provide a power semiconductor device which has a light weight, a high heat dissipation efficiency, and a high rigidity.

Solution to Problem

As a result of intensive studies to solve the above problems, the inventors found that the above problems can be solved by forming protruding portions on the base, and have completed the present invention.

Advantageous Effects of Invention

According to the present invention, a power semiconductor device which has a light weight, high heat dissipation efficiency, and high rigidity can be provided.

BRIEF DESCRIPTION OF DRAWINGS

FIG. 1 is a cross-sectional view of a power semiconductor device 100 according to a first embodiment of the present invention.

DESCRIPTION OF EMBODIMENTS

Figure 2A:
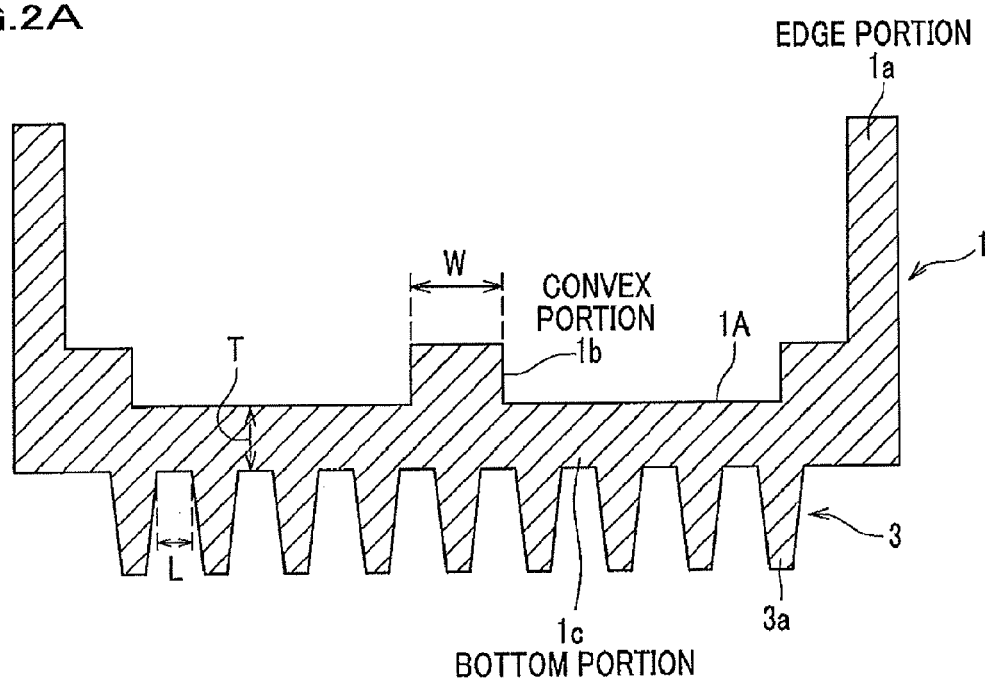
FIG. 2A is a cross-sectional view of only a base 1 of the power semiconductor device 100.

Embodiments to perform the present invention will be explained hereinafter with appropriate reference to the accompanying drawings.

[First Embodiment]
<Configuration>

As shown in FIG. 1, a power semiconductor device 100 according to a first embodiment is provided with a base 1, semiconductor circuits 2 which are arranged on the base 1, and a cooling fin 3 which cools the semiconductor circuits 2.

The base 1 has an edge portion 1a surrounding a periphery thereof, a protruding portion 1b which is formed by bridging the edge portion 1a inside a space formed by being surrounded with the edge portion 1a, and a bottom portion is on which the protruding portion 1b is formed. The edge portion 1a is one form of the "protruding portions" defined in claims. Therefore, in the present embodiment, there are two or more "protruding portions" defined in claims. Details of the edge portion 1a, the protruding portion 1b, and the bottom portion 1c will be described later with reference to FIG. 2A.

As shown in FIG. 1, the power semiconductor device 100 according to the first embodiment is further provided with a cooling jacket 4, a seal member 5, a block 6, electrodes 7, and wirings 2f. A silicone gel 9 is filled in the base 1, and thus the semiconductor circuits 2 are sealed. In addition, a refrigerant (not shown) flows through a space which is formed between the base 1 and the cooling jacket 4.

The base 1 is a member made of aluminum. Plating with nickel or the like is applied to a surface of the base 1, although not shown. In this manner, it is possible to improve a corrosion resistance as well as connectivity (fixing strength) of the semiconductor circuit 2 described later.

Figure 2B:
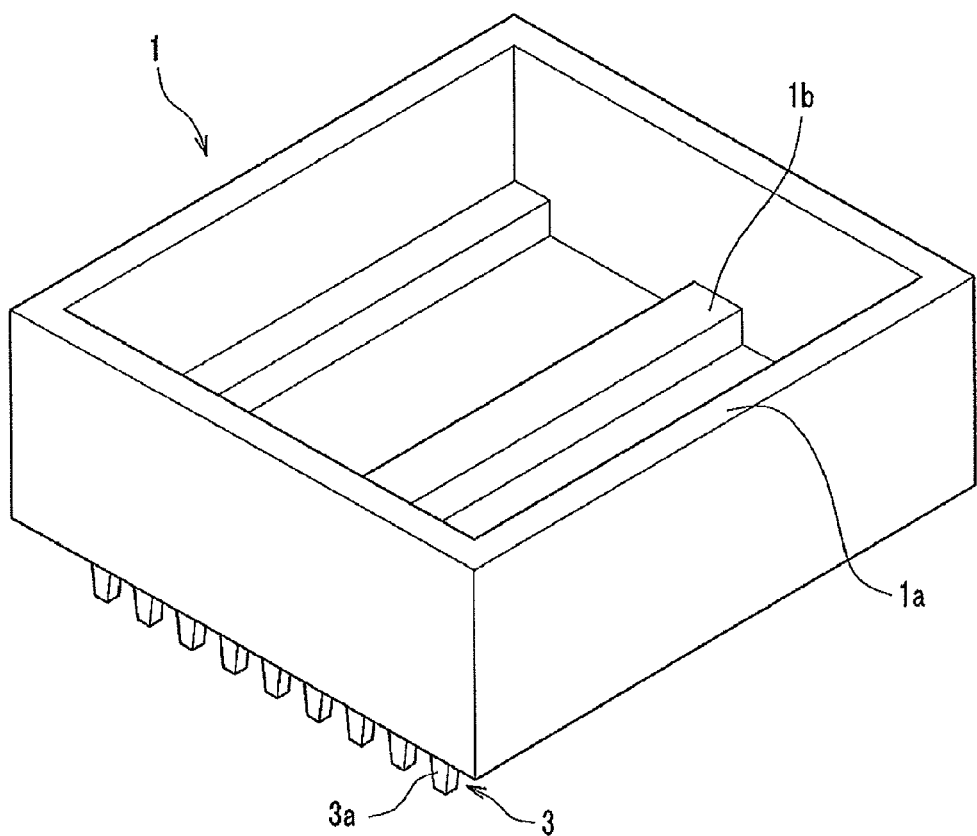
FIG. 2B is a perspective view of only the base 1 of the power semiconductor device 100.

The base 1 has the edge portion 1a, the protruding portion 1b, and the bottom portion c, as shown in the above FIGS. 1 and 2. The edge portion 1a and the protruding portion 1b have respective predetermined heights and widths independently. This means that the power semiconductor device 100 is formed with the edge portion 1a and the protruding portion 1b on an upper surface 1A of the bottom portion 1c. Here, the term "height" is a length in a direction perpendicular to the bottom portion 1c of the base 1. And, the term "width" is a length in a direction parallel to the bottom portion 1c of the base 1.

Hereinafter, relationships among the base 1, the protruding portion 1b, and pin fins 3a which constitute the cooling fin 3 in the power semiconductor device 100 will be explained.

First, a relationship between the base 1 and the protruding portion 1b is explained. As shown in FIG. 2A, a width of the protruding portion 1b is denoted by "W". A thickness of the bottom portion 1c of the base 1 is denoted by "T". In addition, a distance between adjacent pin fins 3a (junctions of the pin fins 3a with the base 1 are starting points) is denoted by "L".

When the width "W" and the thickness "T" are denoted as described above, the width "W" is longer than the thickness "T".

In this manner, since the power semiconductor device 100 has the protruding portion 1b on the surface of the base 1 (specifically the bottom portion 1c) and the above relationship is satisfied, the rigidity of the base 1 can be increased while a thickness of the bottom portion 1c of the base 1 is reduced.

Furthermore, a weight of the power semiconductor device 100 can be decreased because the thickness of the bottom portion 1c is reduced.

The base of a conventional power semiconductor device which has a cooling mechanism cooled by the refrigerant or the like is usually made of a copper. It is because there is a problem that when aluminum or the like is used for the base, a thermal resistance of the base is increased and the semiconductor circuit becomes difficult to be cooled. In other words, it is because heat transfer from the semiconductor circuit to the cooling unit (such as cooling fin) is difficult to be performed and thus the heat dissipation efficiency is decreased.

For example if aluminum is used, a thermal expansion of the base itself is increased because a coefficient of thermal expansion of aluminum is large. Therefore, the base may be deformed by the thermal expansion. As a result, there is a problem that a lifetime of a solder provided on the base is shortened.

However, in the power semiconductor device 100 according to the present embodiment, aluminum is used as a material which constitutes the base 1. There is the problem described above, if aluminum is simply used as the material of the base 1. Therefore, the power semiconductor device 100 is provided with the protruding portion 1b. By setting as described above the relationship between the width "W" of the protruding portion 1b and the thickness "T" of the bottom portion 1c of the base 1, it is possible to form the base 1 having a thickness which is not conventionally achieved with copper. Therefore, the thickness of the base 1 can be reduced, thereby suppressing an increase of a thermal resistance to the cooling fin 3 from the semiconductor circuit 2. As a consequence, the high heat dissipation efficiency can be maintained even if aluminum is used as the material of the base 1.

In addition, the high rigidity of the power semiconductor device 100 can be maintained even if the thickness of the base is reduced. Furthermore, the weight of the power semiconductor device 100 can be reduced because the thickness of the base 1 is reduced. In addition, since the thickness of the base 1 is reduced, an amount of the thermal expansion of the base 1 can be decreased, thereby suppressing a warpage of the base 1 caused by an ununiformity of the temperature. As a result, the junction portion by the solder can be prevented from being deteriorated, as well as the refrigerant can be prevented from leaking.

There is no particular limitation to a specific numerical range of the width "W" and the thickness "T". For example, when a length of the base 1 in a lateral direction on the sheet of FIG. 2A is 150 millimeters and a length (depth) of the base 1 in a perpendicular direction to the sheet of FIG. 2A is 60 millimeters, the width "W" can be more than 2 millimeters and not more than 10 millimeters and the thickness "T" can be less than or equal to 2 millimeters. In addition, as a length of the other portions, for example, a height (including the thickness of the bottom portion 1c) of the edge portion 1a can be 15 millimeters.

Next, the relationship between the protruding portion 1b and the pin fin 3a is explained. In the power semiconductor device 100 according to the present embodiment, a shortest distance "L" among distances between adjacent pin fins 3a is shorter than the width "W" of the protruding portion 1b. The reason why the power semiconductor device 100 is configured in this manner will be explained.

In the power semiconductor device 100 according to the present embodiment, the width "W" and the shortest distance "L" satisfy the above relationship. By satisfying such a relationship, the distances between adjacent pin fins 3a can be made short. As a result, it is possible to make a sufficient contact area between the pin fins 3a and the refrigerant, thereby sufficiently cooling the semiconductor circuit 2 through the pin fins 3a (i.e., cooling fin 3).

There is no particular limitation to specific numerical values for the cooling fin 3. For example, similar to the above, when the length of the base 1 in the lateral direction on the sheet of FIG. 2A is 150 millimeters and the length (depth) of the base 1 in the perpendicular direction to the sheet of FIG. 2A is 60 millimeters, the height of the pin fins 3a can be 6 millimeters and the shortest length "L" can be 1 millimeter. However, if the distance between adjacent pin fins 3a is too long, the number of the pin fins 3a is too small, and the heat dissipation efficiency may be decreased. On the other hand, if the distance between pin fins 3a is too short, dust and the like get stuck between adjacent pin fins 3a, and the heat dissipation efficiency may also be decreased. For this reason, the shortest distance "L" is preferably at least about 1 millimeter.

Returning to FIG. 1, an overall configuration of the power semiconductor device 100 will be explained.

The semiconductor circuit 2 constitutes a circuit group to function as the power semiconductor device 100. More specifically, the semiconductor circuit 2 includes IGBT elements 2a, diode elements 2b, solders 2c under the elements, substrate top surface conductive layers 2d, and insulating substrates 2e. The semiconductor circuits 2 are electrically connected to the electrodes 7 through the wirings 2f. The IGBT elements 2a and the diode elements 2b are electrically connected with each other through the wirings 2f. And, the diode elements 2b are also electrically connected to the substrate top surface conductive layers 2d through the wirings 2f.

The semiconductor circuit 2 is located between the edge portion 1a and the protruding portion 1b, and secured to the upper surface (circuit connection surface) 1A of the bottom portion 1c of the base 1. In this case, the semiconductor circuit 2 is secured to the upper surface 1A (i.e., base 1) through a substrate bottom surface conductive layer 10 and a under substrate solder 11.

In order to efficiently discharge heat generated by the IGBT elements 2a to the outside (specifically to the refrigerant), the insulating substrates 2e having an excellent thermal conductivity are used. More specifically, as materials of which the insulating substrates 2e is made, for example, ceramics such as silicon nitride, aluminum nitride, and alumina are used. By the insulating substrates 2e made of such materials, heat from the IGBT elements 2a can be efficiently discharged to the outside of the semiconductor circuit 2.

The heat from the semiconductor circuits 2 is transferred through the substrate bottom surface conductive layer 10, the under substrate solder 11, the base 1, and the cooling fin 3, in this order, to the refrigerant which is in contact with the cooling fin 3. Therefore, the cooling fin 3 is a member which cools the semiconductor circuit 2.

In the power semiconductor device 100, the IGET element 2a is used for a switching use, and the diode element 2b is used for a rectifying use.

In the power semiconductor device 100, a size of each member constituting the semiconductor device 100 is as follows. That is, the insulating substrate 2e has a length of 50 millimeters in the lateral direction on the sheet of FIG. 1, a length of 30 millimeters in the perpendicular direction to the sheet of FIG. 1, and a thickness of 0.3 millimeters. Lengths of the substrate top surface conductive layer 2d and the substrate bottom surface conductive layer 10 are all the same, and the length in the lateral direction on the sheet of FIG. 1 is 48 millimeters, the length in the perpendicular direction to the sheet of FIG. 1 is 28 millimeters, and the thickness is 0.5 millimeters. Here, the substrate top surface conductive layers 2d are shown as separate members in FIG. 1, but the above lengths are lengths when they are considered as an integral product. That is, a length from the left end of the substrate top surface conductive layer 2d to the right end of the substrate top surface conductive layer 2d in FIG. 1 is 48 millimeters.

The length of the IGBT element 2a in the lateral direction on the sheet of FIG. 1 is 10 millimeters, and the length of the diode element 2b in the lateral direction on the sheet of FIG. 1 is 6 millimeters. In these two elements, the length in the perpendicular direction to the sheet of FIG. 1 and the thickness are common to the both elements, and the length in the perpendicular direction to the sheet of FIG. 1 is 10 millimeters and the thickness is 0.1 millimeter.

As described above, the length of the insulating substrate 2e in the lateral direction on the sheet of FIG. 1 is longer than the lengths of the substrate top surface conductive layer 2d and the substrate bottom surface conductive layer 10 in the lateral direction on the sheet of FIG. 1.

Therefore, even if side surfaces of the semiconductor circuit 2 are brought into contact with the edge portion 1a or the protruding portion 1b, the insulating substrate 2e is adapted to be in contact with the edge portion 1a or the protruding portion 1b. As a consequence, electrical insulation between the base 1 and the semiconductor circuit 2 can be maintained.

The cooling fin 3 is, as shown in FIG. 1, formed on one side of the base 1 opposite to a surface on which the semiconductor circuit 2 is arranged. In the present embodiment, the cooling fin 3 is formed integrally with the base 1. They may be formed separately to be subsequently joined together, but detailed information on this point will be described later.

As described above, the cooling fin 3 is constituted by a plurality of pin fins 3a. As a material of which the cooling fin 3 is made, the same material with base 1 is used. This means that the material constituting the cooling fin 3 in the present invention is aluminum. As described above, the refrigerant flows through the space which is formed between the base 1 and the cooling jacket 4 (described later), and the refrigerant and the cooling fin 3 are in contact with each other. In this manner, the heat is transferred to the refrigerant from the cooling fin 3, and the semiconductor circuit 2 is cooled.

As described above, the base 1 and the cooling fin 3 are made of aluminum. Aluminum is excellent in moldability and workability as compared to copper. Therefore, by constituting the base 1 and the cooling fin 3 by aluminum, they can be integrally formed as in the present embodiment. By the fact that they can be formed integrally, it can be realized that the manufacturing process is simplified and the manufacturing cost is reduced. Such an integral forming can be carried out by forging, for example.

A portion of the base 1 is forged to form only the cooling fin 3 at first, and the base 1 portion may be cut out by machining. By taking such a method, since only the surface of the cooling fin 3 side is necessary to be formed by forging, there is an advantage that the forging is easy. Of course, the base 1 and the cooling fin 3 may be joined by brazing together after forged separately. In this manner, since the surface of the cooling fin 3 is not required to be formed during forging the base 1, there is an advantage that the forging is easy.

The cooling jacket 4 is secured to the base 1 by fastening bolts not shown. The refrigerant such as water flows through a space which is formed by the cooling jacket 4 and the base 1. In addition, a seal member 5 such as an O-ring is provided between connection surfaces of the base 1 and the cooling jacket 4. As a consequence, a leakage of the refrigerant is prevented. A block 6 is configured to electrically insulate the base 1 from an electrode 7 described later. In other words, the block 6 is an insulating member disposed between the base 1 and the electrode 7. As a material of which such a block 6 is made, a member including a resin is used in the present embodiment. As specific examples of the resin, a PBT (PolyButylene Terephthalate), a PPS (PolyPhenylene Sulfide) and the like are listed.

The electrodes 7 are connection terminals which are connected to the semiconductor circuits 2 through wirings (electrical signal lines) 2f, and are connected to an external device not shown.

The silicone gel 9 is filled in a space which is formed by being surrounded with the edge portion 1a of the base 1. As shown in FIG. 1, a height of the edge portion 1a is higher than that of the silicone gel 9. Therefore, a leakage of the silicone gel 9 is prevented. On the other hand, the height of the silicone gel 9 is higher than that of the semiconductor circuit 2. Therefore, the semiconductor circuit 2 is encapsulated by the silicone gel 9. In this manner, the semiconductor circuit 2 is protected from an external atmosphere such as moisture and dust. In addition, although not shown, a cover member made of the resin is arranged so as to cover the entire upper surface of the silicone gel 9. By the cover member, an inside of the power semiconductor device 100 is protected from the external atmosphere.

<Effect>

While the power semiconductor device 100 is in operation, the IGBT element 2a and the diode element 2b generate especially a large amount of Joule heat. In order to cool the power semiconductor device 100, it is important to transmit the Joule heat generated from the IGBT element 2a and the diode element 2b to the lower surface of the base 1 with as small a loss as possible, and to dissipate the heat to the refrigerant. Taking this heat dissipation into account, the thickness of the bottom portion 1c of the base 1 in the power semiconductor device 100 is thinner than the thickness (height) of the edge portion 1a. For this reason, the power semiconductor device 100 has a small loss of heat conduction and high heat dissipation efficiency.

Reducing the thickness of the bottom portion 1c smaller than the edge portion 1a and the protruding portion 1b leads to suppression of reducing a fatigue life of the under substrate solder 11 which secures the semiconductor circuit 2. The temperature of power semiconductor device 100 becomes high during operation as described above. Therefore, a large thermal stress is applied to members from each other members having different coefficient of thermal expansion. For example, the coefficient of thermal expansion of the insulating substrate 2d is about 2.5 ppm/K if it is made of silicon nitride, and is about 7.1 ppm/K if it is made of alumina. On the other hand, the coefficient of thermal expansion of the base 1 is about 24.0 ppm/K if it is made of aluminum. In this manner, the coefficient of thermal expansion of the insulating substrate 2d and that of the base 1 are very different from each other.

Therefore, if temperature change is repeated by turning on/off of the power semiconductor device 100, the under substrate solder 11 which is a member connecting the insulating substrate 2d and the base 1 with each other, may be cracked by the thermal fatigue. Therefore, ensuring a thermal fatigue life of the under substrate solder 11 is a major issue. In view of this point, the present invention has been devised. As described above, since the thickness of the bottom portion 1c of the base 1 is reduced in the power semiconductor device 100, the thermal expansion at apart of the base 1 to which the under substrate solder 11 is secured is reduced. As a result, the reduction of fatigue lifetime of the under substrate solder 11 can be suppressed.

In addition, the refrigerant flows through on a lower portion (a side to which the cooling jacket 4 is secured) of the base 1. Therefore, a pressure of the refrigerant is applied to the lower portion of the base 1. If the warpage deformation of the base 1 is increased by the pressure, the refrigerant flowing through on the lower portion of the base 1 may be leaked to the outside. Therefore, it is also an important issue to maintain a high rigidity of the base 1 while the thickness of the base 1 is reduced. In view of this point, the base 1 is formed with the protruding portion 1b. In this manner, the rigidity of the entire base 1 can be increased while the thickness of the bottom portion of the bases 1 is reduced. In addition, the high rigidity of the base 1 is further increased by the edge portion 1a.

The power semiconductor device 100 has the protruding portion 1b formed near a center of the base 1 (see FIGS. 1 and 2). Therefore, two regions formed between the protruding portion 1b and the two opposed edge portions 1a have substantially the same area. As a consequence, the two semiconductor circuits 2 can be respectively secured to the two regions by setting the semiconductor circuit 2 to about the size of the area.

In other words, the semiconductor circuits 2 can be respectively fitted into the regions (concaves) which are formed by the edge portion 1a and the protruding portion 1b, during production of the power semiconductor device 100. In this manner, it is not necessary to perform a complicated positioning of the semiconductor circuit 2. As a result, there is no need to prepare and set jigs and tools for positioning separately at the time of soldering, thereby reducing the production cost and the production time.

Effects described above will be explained in more detail with reference to FIGS. 3 to 8.

Figure 3A:
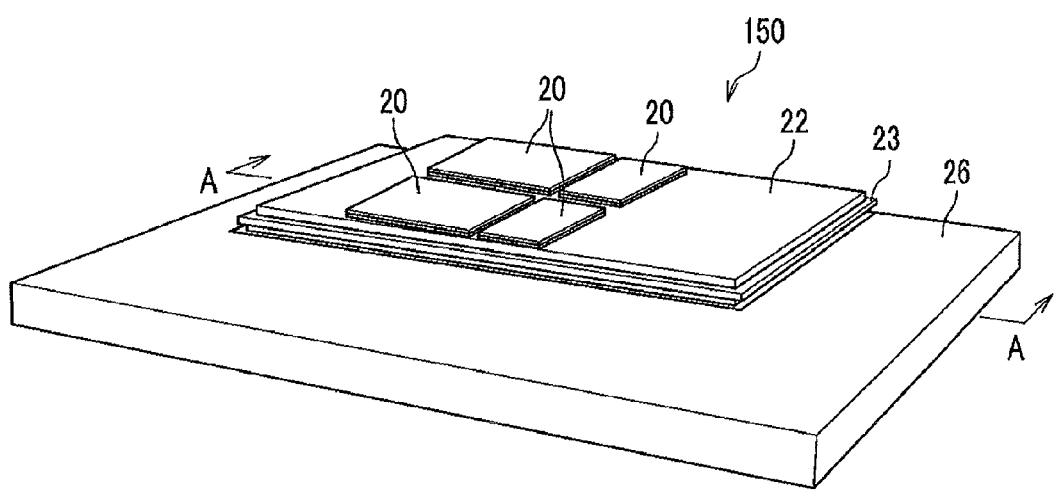
FIG. 3A is a perspective view showing a model member 150 for evaluating a thermal resistance and a lifetime of the power semiconductor device 100.

A model member 150 as shown in FIG. 3A is prepared in order to confirm the effects by the power semiconductor circuit 100.

Figure 3B:
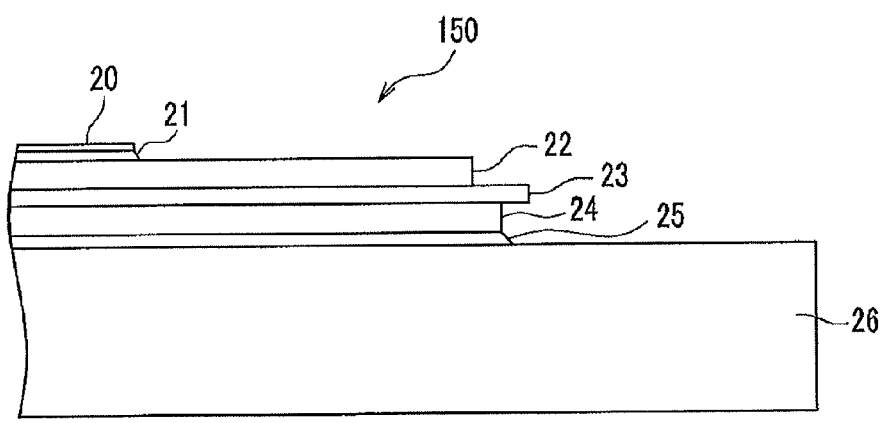
FIG. 3B is a cross-sectional view taken along a line A-A in FIG. 3A.

A cross-sectional view taken along a line A-A in FIG. 3A is shown in FIG. 3B. The model member 150 includes substrates 20 for elements, under element solders 21, a substrate top surface conductive layer 22, an insulating substrate 23, a substrate bottom surface conductive layer 24, an under substrate solder 25, and a base 26.

Here, the substrate 20 for elements corresponds to the IGBT element 2a and the diode element 2b shown in FIG. 1. In a similar way, the under element solder 21 corresponds to the solder 2c under the elements, the substrate top surface conductive layer 22 corresponds to the substrate top surface conductive layer 2d, the insulating substrate 23 corresponds to the insulating substrate 2e, the substrate bottom surface conductive layer 24 corresponds to the substrate bottom surface conductive layer 10, the under substrate solder 25 corresponds to the under substrate solder 11, and the base 26 corresponds to the bottom portion 1c of the base 1, respectively shown in FIG. 1.

Figure 4:
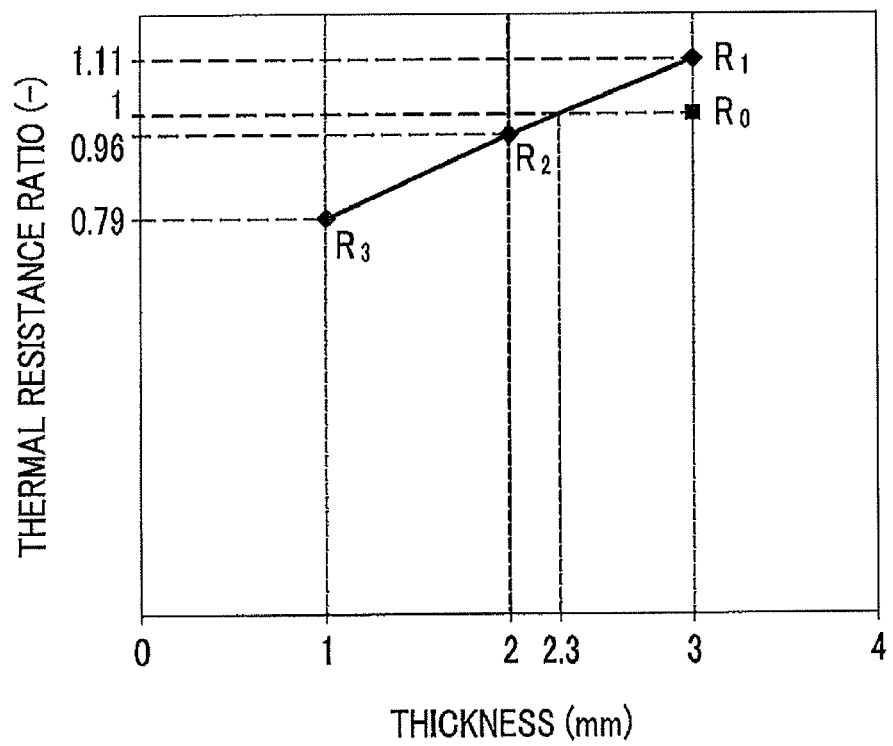
FIG. 4 is a graph showing a relationship between thickness of the base and thermal resistance ratio.

The effect of reducing the thermal resistance of the power semiconductor device 100 has been evaluated by using the model member 150. The result is shown in FIG. 4. The horizontal axis of FIG. 4 stands for a thickness of the base 26 (vertical thickness in FIG. 3B). The vertical axis stands for a normalized value (thermal resistance ratio) when assuming the thermal resistance as 1 (plot R0) in the case where copper base (conventional base) with 3 millimeters thickness is used.

Measurement of the thermal resistance of the model member 150 has been carried out by performing a heat transfer analysis under a condition that an upper surface of the substrate 20 for the elements is kept at 150° C. and the heat is dissipated from a lower surface of the base 26. In other words, the thermal resistance between the substrate 20 for the elements and the lower surface of the base 26 has been measured. The thermal conductivity of aluminum is about 240 W/mK. And the thermal conductivity of copper is about 390 W/mK. Accordingly, the thermal conductivity of copper is 1.6 times as large as compared to the thermal conductivity of aluminum.

As shown in FIG. 4, the thermal resistance was increased by 11% (plot $R_1$) when aluminum base 26 with 3 millimeters thickness same as the copper base was used. However, the thermal resistance was decreased by reducing the thickness of the base 26. More specifically, the thermal resistance was decreased by 4% (plot $R_2$) compared to the copper base with 3 millimeters thickness when the thickness of the base 26 is reduced to 2 millimeters. The thermal resistance was decreased by 21% (plot $R_3$) compared to the copper base with 3 millimeters thickness when the thickness of the base 26 is reduced to 1 millimeter. Incidentally, the thermal resistance was same as that of the copper base when the thickness of the base 26 is 2.3 millimeters. As described above, the base 26 can have an excellent thermal resistance value by reducing the thickness compared to the conventional copper base. In this manner, the power semiconductor device according to the present invention can have excellent heat dissipation efficiency while the weight thereof is reduced compared with the conventional power semiconductor device.

Figure 5:
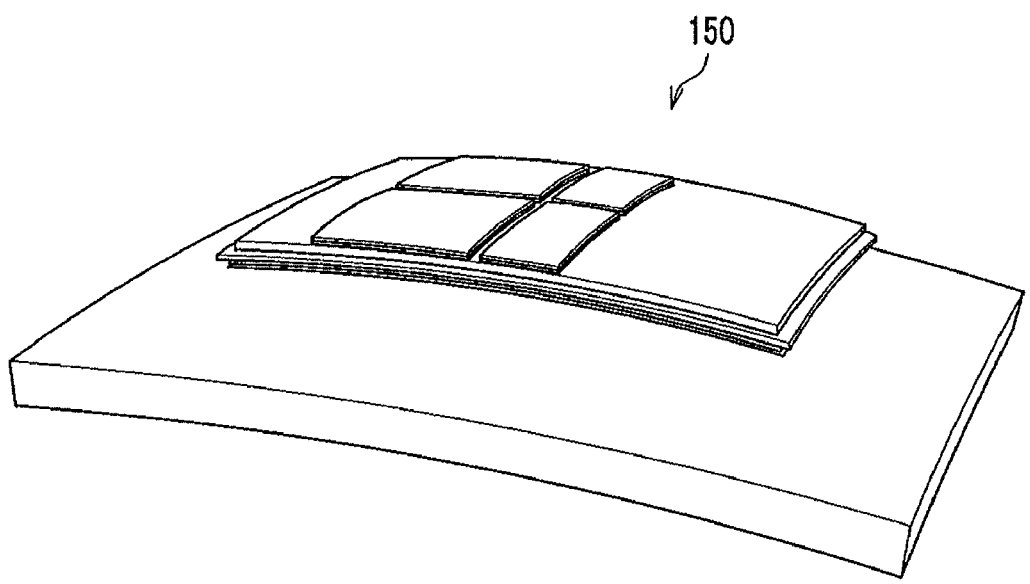
FIG. 5 is a view showing a state of a warpage of the model member 150 when heated.

Next, the lifetime of the solders (corresponding to the under substrate solders 11, 25) which secure the semiconductor circuit 2 to the base 1 were evaluated. FIG. 5 shows a deformed shape of the model member 150 at −40° C. with an amount of deformation enlarged by ten times larger than the actual deformation when the temperature of the entire model member 150 was changed from 125° C. to −40° C. The amount of deformation was calculated by the thermal stress analysis using the finite element method over the temperature range of 125° C. to −40° C.

Figure 6:
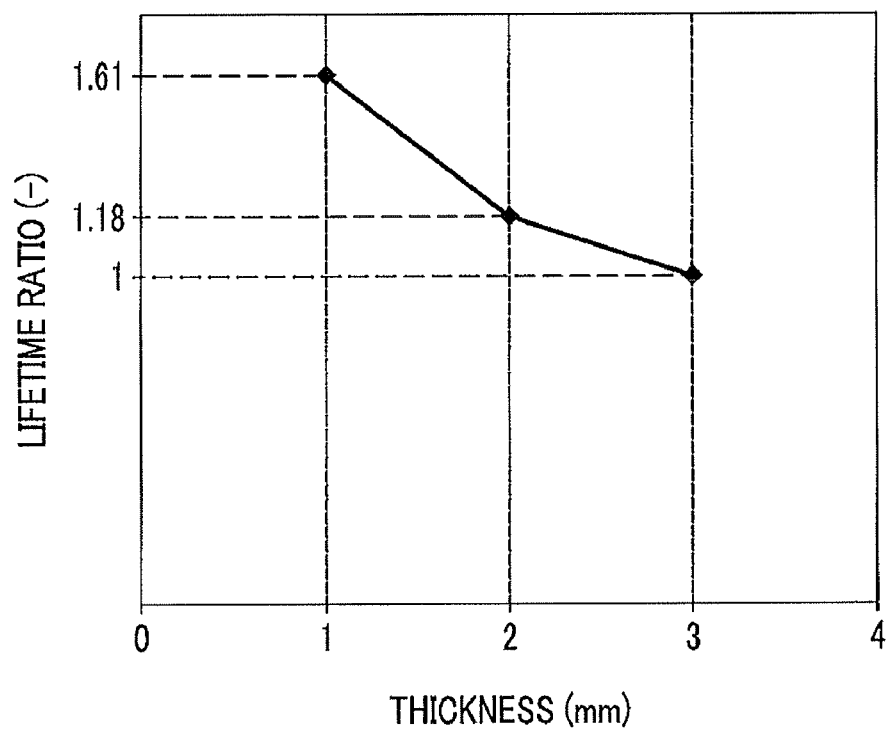
FIG. 6 is a graph showing a relationship between thickness of the base and lifetime ratio.

The power semiconductor device 100 shown in FIG. 1 becomes in high temperature during operation. For this reason, the power semiconductor device 100 is also deformed in the same manner as the model member 150 shown in FIG. 5. Therefore, it is important to prevent the reduction of the fatigue life of the solder which secures the semiconductor circuit 2 to the base 1, as described above. FIG. 6 shows a relationship between the thickness of the base 26 and the fatigue life of the under substrate solder 25.

FIG. 6 shows normalized values (lifetime ratio) when assuming the lifetime of the solder as 1 in the case where the thickness of the base is 3 millimeters. The lifetime is converted from plastic strain of the under substrate solder 25 which is obtained from the results of the thermal stress analysis in FIG. 5. Here, the base is made of aluminum.

As shown in FIG. 6, the lifetime of the under substrate solder 25 has become longer by 18% when the thickness of the base 26 is 2 millimeters as compared with the case of 3 millimeters. In addition, the lifetime of the under substrate solder 25 has become longer by 61% when the thickness of the base 26 is 1 millimeter as compared with the case of 3 millimeters. In this manner, the lifetime of the solder is made longer by reducing the thickness of the base 26.

Figure 7A:
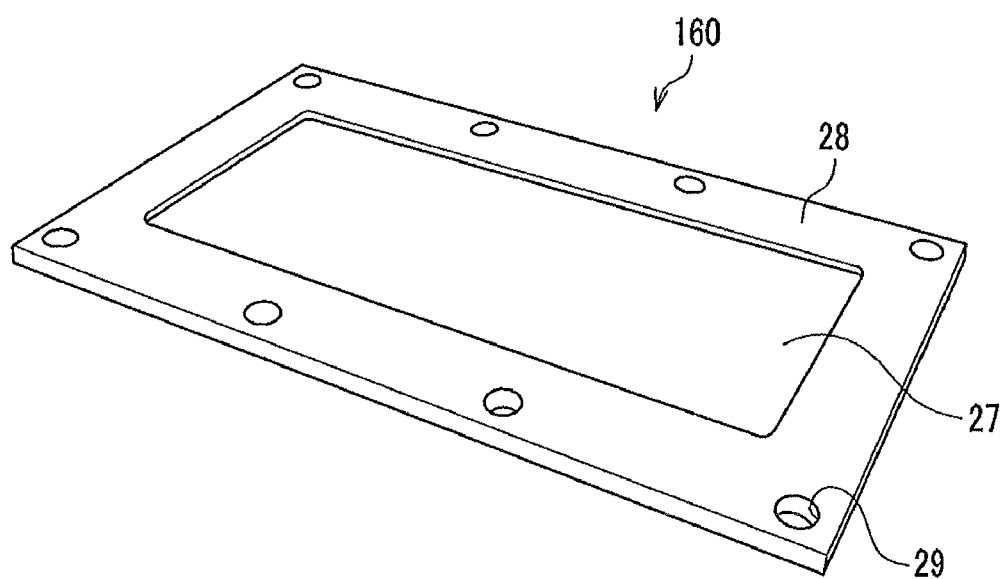
FIG. 7A is a view showing a model member 160 for evaluating a warpage amount of the base.
Figure 7B:
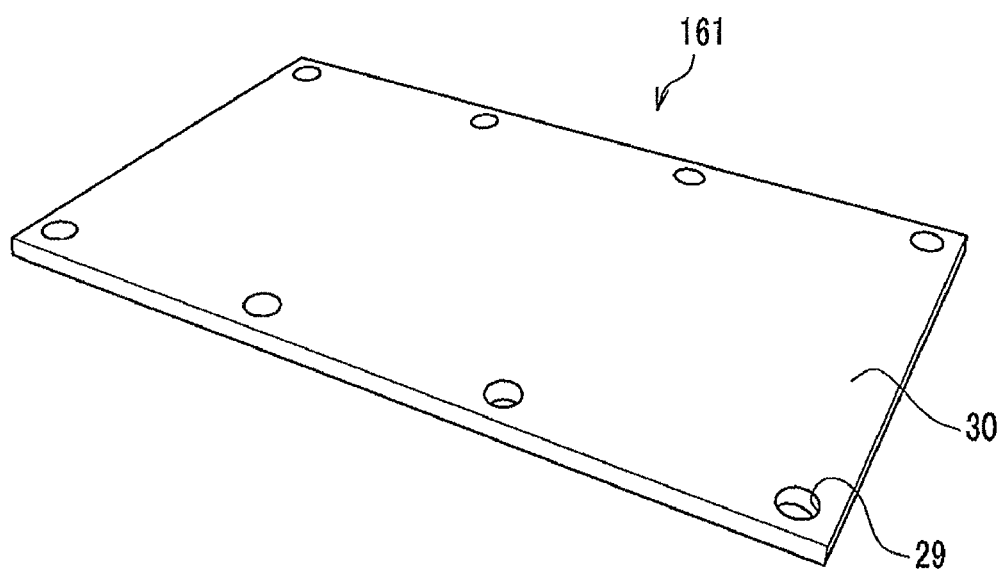
FIG. 7B is a view showing a model member 161 for evaluating a warpage amount of the base.

Next, the effect of preventing the leakage of the refrigerant, which flows through between the base 1 and the cooling jacket 4 in the power semiconductor device 100, has been evaluated. FIG. 7A shows a model member 160 formed with a protruding portion 28 on edges of the base 27, i.e., a model member 160 provided with a protruding portion 28 in the vicinity of four edges of a rectangular plate. FIG. 7B shows a model member 161 formed without a protruding portion. In any of the model member 160 and the model member 161, bolt bores 29 through which the cooling fin is secured, are also shown.

As described above, by reducing the thickness of the base, the increase of the thermal resistance can be suppressed, and thus the reduction of the lifetime of the solder can be suppressed, even if the aluminum base is used. However, if a base 30 is configured without a protruding portion such as the model member 161 shown in FIG. 7B, the rigidity of the base 30 is reduced when the thickness thereof is simply reduced. It is particularly important to ensure the sufficient rigidity of the base 1 in the power semiconductor device 100, since the pressure of the refrigerant is applied to the lower surface of the base 1, as described above. Therefore, by providing the protruding portions 1b and 28 as shown in FIGS. 1 and 7A, the warpage of the bases 1, 27 by the refrigerant pressure can be suppressed, and thus the leakage of the refrigerant can be prevented.

Figure 8:
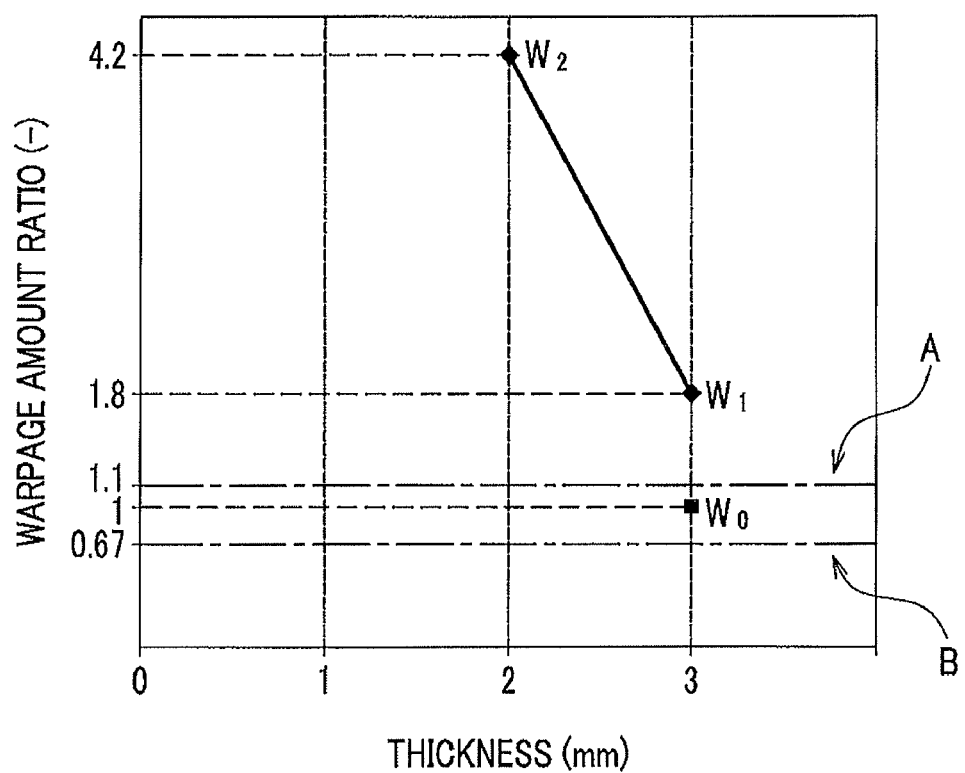
FIG. 8 is a graph showing a relationship between thickness of the base and warpage amount ratio.

FIG. 8 is a graph showing the maximum warpage amount at the edge portion 28 of the base 27, compared with a result of the model member 161 using the conventional copper base with millimeters thickness. The maximum warpage amount was calculated by carrying out the finite element analysis when water pressure is applied to the lower surface of the base 27, of the model member 160, 161 shown in FIGS. 7A, 7B. The vertical axis stands for normalized value (warpage amount ratio) when assuming the warpage amount of the copper base as 1 in the case where the thickness thereof is 3 millimeters. In FIG. 8, the result of the model member 161 using the conventional copper base with 3 millimeters thickness is also shown (plot $W_0$).

In addition, as for the structure (model member 160 made of aluminum) shown in FIG. 7A, the warpage amount ratio (1.1) when the thickness of the base 27 is 2 millimeters and the thickness of the protruding portion 28 is 4 millimeters is indicated by a one-dot chain line A. Similarly, the warpage amount ratio (0.67) when the thickness of the base 27 is 2 millimeters and the thickness of the protruding portion 28 is 5 millimeters is indicated by a one-dot chain line B.

As shown in FIG. 8, when the aluminum base with 3 millimeters thickness without the protruding portion (model member 161 made of aluminum) was used, the warpage amount ratio was increased by 1.8 times (plot $W_1$) compared with the case of using the copper base. When the aluminum base with 2 millimeters thickness without the protruding portion (model member 161 made of aluminum) was used, the warpage amount ratio was increased by 4.2 times (plot $W_2$) compared with the case of using the copper base. As described above, it is obviously understood that the warpage amount is quite large when the conventional copper base is simply changed to the aluminum base.

On the other hand, when the model member 160 made of aluminum with the protruding portion 28 of 4 millimeters thickness and with the base 27 of 2 millimeters thickness is used (one-dot chain line A), the increase of the warpage amount ratio was suppressed to 10%. In other words, the warpage amount was not excessively increased even if the aluminum base with 2 millimeters thickness was used instead of the conventional copper base with 3 millimeters thickness. Furthermore, when the thickness of the protruding portion 28 was set to 5 millimeters, the warpage amount was decreased by 33%. This means that the warpage amount can be maintained to the same extent as the conventional base, or can be significantly decreased compared to the conventional base, while the thickness of the base can be reduced compared to the conventional copper base by forming the protruding portion 28 on the base.

<Production Method>

Next, a production method of the power semiconductor device 100 shown in FIG. 1 will be explained with reference to FIG. 9.

Figure 9A:
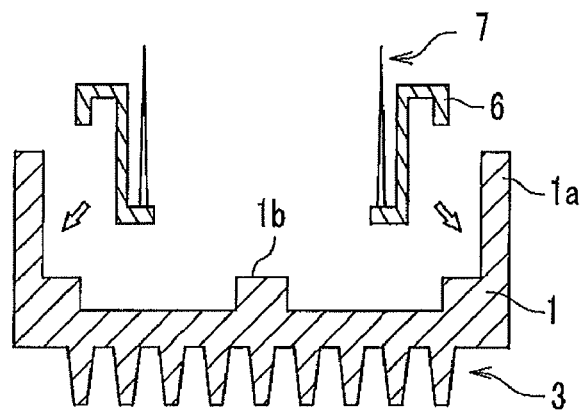
FIGS. 9A, 9B, 9C, and 9D are views showing a production method of the power semiconductor device 100.

First, the base 1 including the cooling fin 3 is manufactured by forging or other methods, as described above. Then, the blocks 6 made of the resin are fitted into the edge portion 1a of the manufactured base 1 to be in close contact with inner walls of the base 1 (FIG. 9A). Securing the blocks 6 to the edge portions 1a is performed by bolts, adhesives and the like. In addition, the electrode 7 is embedded into the block 6 to be secured to the block 6 when the block 6 is molded.

Figure 9B:
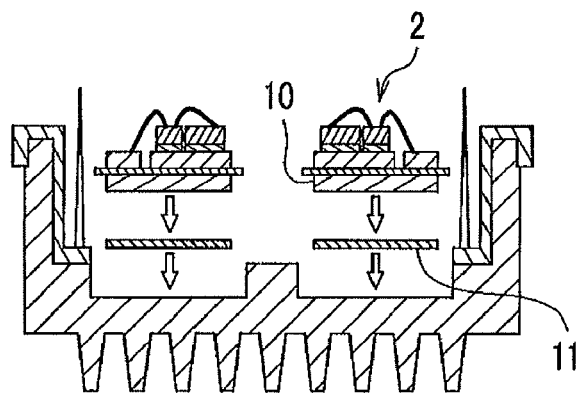

Next, members into which the semiconductor circuit 2 and the substrate bottom surface conductive layer 10 are formed together are respectively secured to the bottom surface 1A of the base 1 through the under substrate solder 11 (FIG. 9B). The securing method is performed as follows. The under substrate solder 11 is mounted on the bottom surface 1A of the base 1, and then the members into which the semiconductor circuit 2 and the substrate bottom surface conductive layer 10 are formed together are respectively mounted on the solder 11. Then, by heating the whole members in a high temperature furnace, the semiconductor circuit 2 and the substrate bottom surface conductive layer 10 are secured (connected) to the base 1 by the under substrate solder 11.

The under substrate solder 11 melts when it is heated in the high temperature furnace. However, the molten solder does not leak to the outside of the base 1 because the edge portion 1a has the base 1. As described above, the positioning of the semiconductor circuit 2 is not required during installation, since the placement of the semiconductor circuit 2 is predetermined by the edge portion 1a and the protruding portion 1b. Therefore, the separate jigs and tools for the positioning are not required.

Figure 9C:
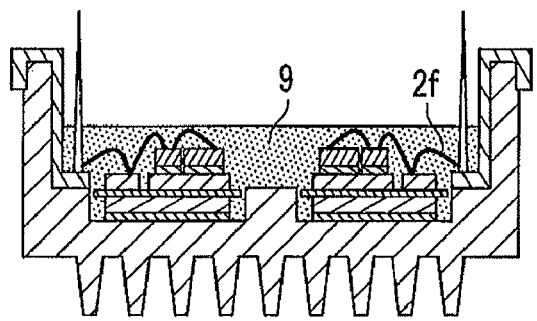

Each of the semiconductor circuits 2 is secured to the base 1 by the under substrate solder 11, and then the semiconductor circuit 2 and the electrode 7 are electrically connected with each other by the wiring 2f (see FIG. 9C).

Next, the silicone gel 9 is injected into the space enclosed by the edge portion 1a (FIG. 9C). In this manner, the semiconductor circuit 2 is sealed by the silicone gel 9. Similar to the above under substrate solder 11, there is no possibility that the silicone gel 9 leaks to the outside of the base 1 because the base 1 has the edge portion 1a. Thereafter, although not shown, a cover member made of the resin is attached so as to cover the upper surface of the silicone gel 9.

Figure 9D:
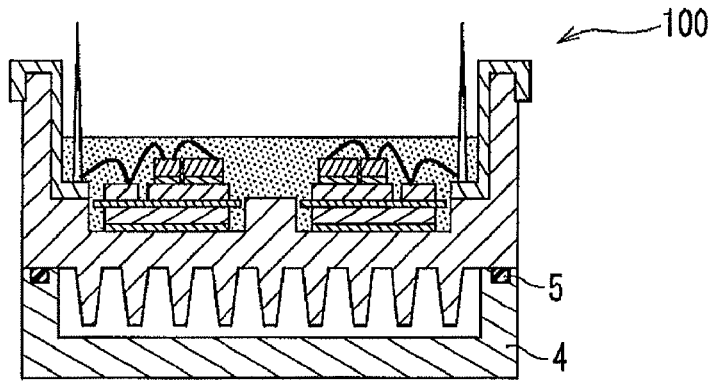

Then, the seal member 5 is interposed between the base 1 and the cooling jacket 4, and in this state the cooling jacket 4 is secured by the bolts (not shown) to the base 1 (FIG. 9D). Finally, the power semiconductor device 100 is manufactured by having the refrigerant flow thorough the space formed between the base 1 and the cooling jacket 4.

It should be noted that the production method of the power semiconductor device 100 is not limited to the above description. Therefore, the power semiconductor device 100 can be manufactured by the methods suitably changed.

[Second Embodiment]

Figure 10:
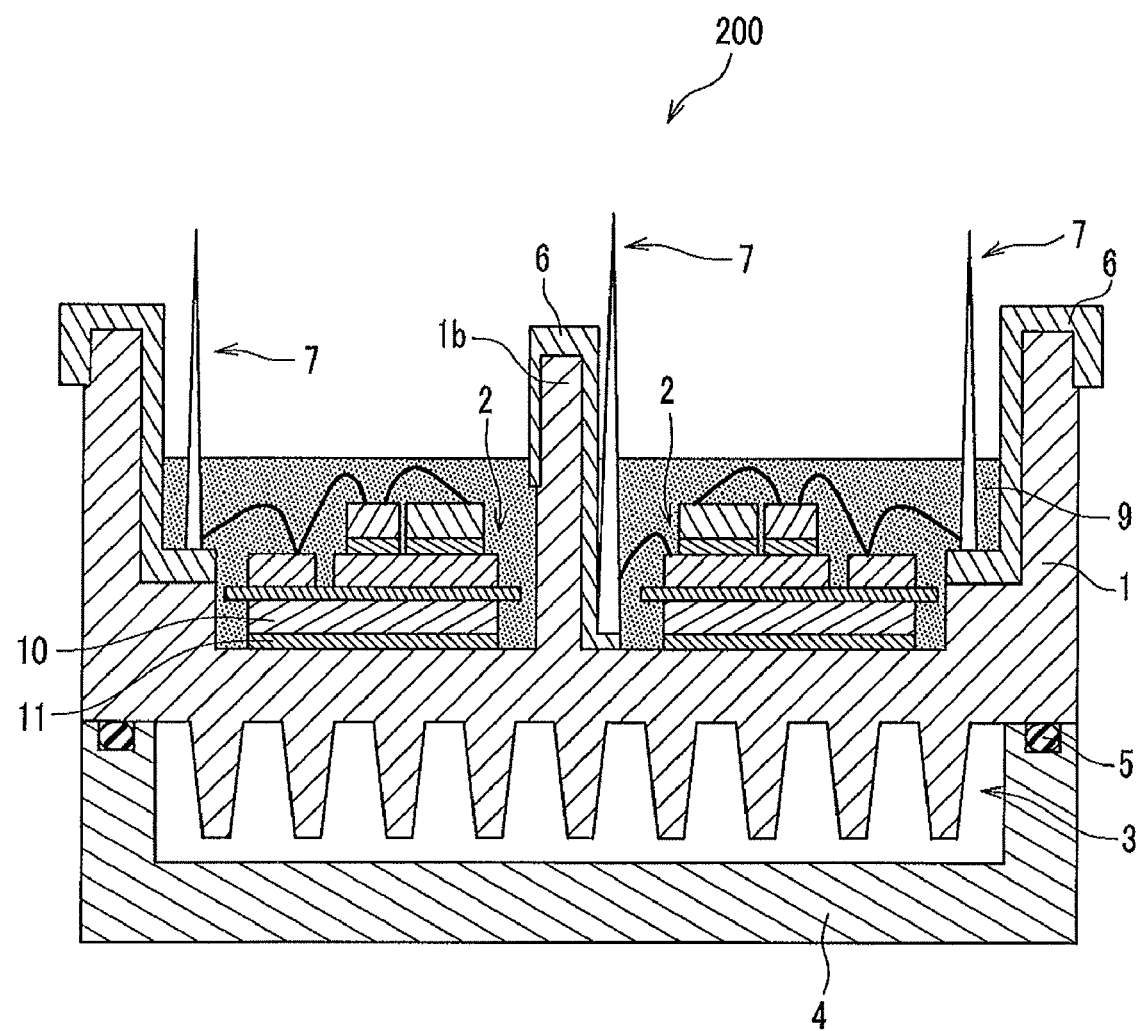
FIG. 10 is a cross-sectional view of a power semiconductor device 200 according to a second embodiment of the present invention.

A power semiconductor device 200 according to a second embodiment will be explained with reference to FIG. 10. The same members as those of the power semiconductor device 100 shown in FIG. 1 are denoted by the same reference signs, and the detailed explanation thereof will be omitted.

In the power semiconductor device 200, the height of the protruding portion 1b in the power semiconductor device 100 is about the same as the height of the edge portion 1a. In other words, the power semiconductor device 100 has one space which is formed by being surrounded with the edge portion 1a only. However, the power semiconductor device 200 has two spaces which are formed by partitioning with the protruding portion 1b the space which is formed by being surrounded with the edge portion 1a.

By forming the protruding portion 1b in this manner, both of the heights of the edge portion 1a and the protruding portion 1b can be higher than the height of the silicone gel 9. The power semiconductor device 200 can be also manufactured similarly to the power semiconductor device 100 by configuring the power semiconductor device 200 in this manner.

In addition, the block 6 and the electrode 7 are newly provided adjacent to the protruding portion 1b. Therefore, the number of the electrodes 7 can be increased as compared with the power semiconductor device 100.

[Third Embodiment]

Figure 11:
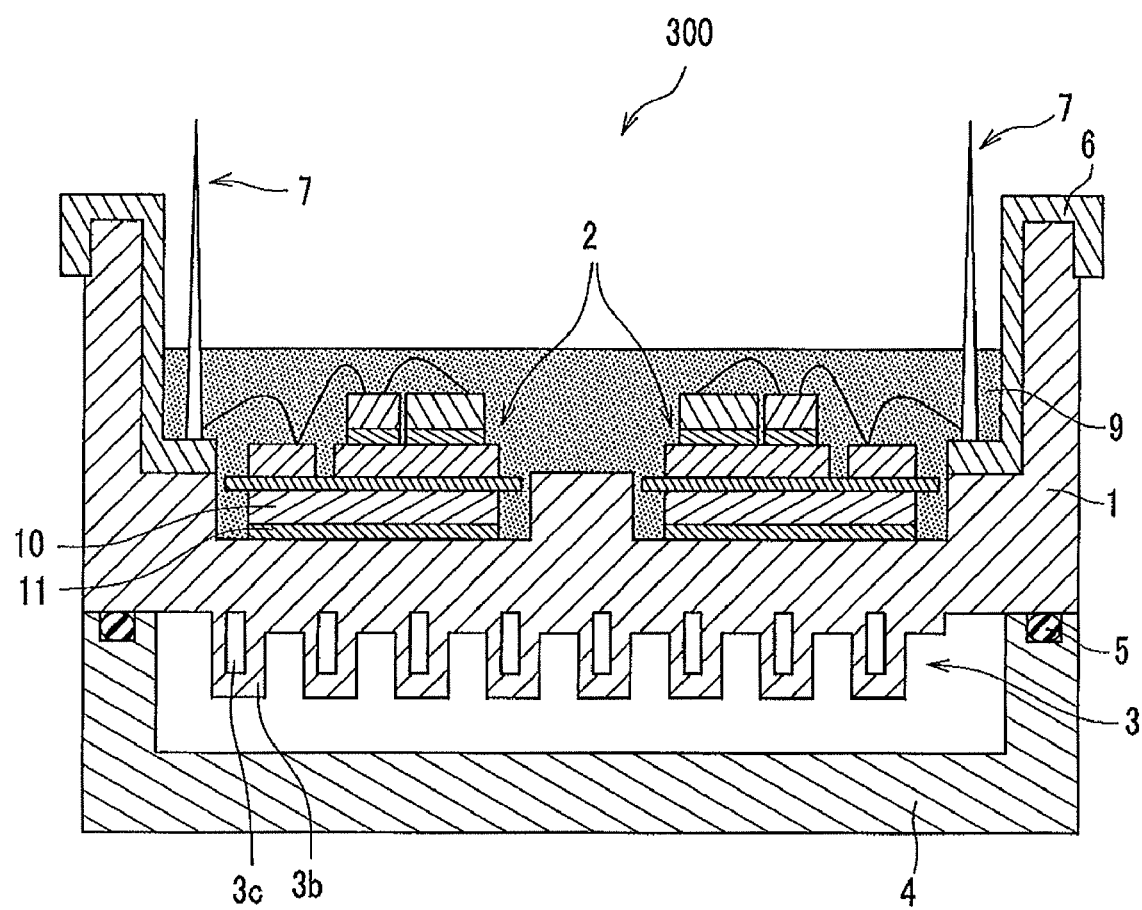
FIG. 11 is a cross-sectional view of a power semiconductor device 300 according to a third embodiment of the present invention.

A power semiconductor device 300 according to a third embodiment will be explained with reference to FIG. 11. The same members as those of the power semiconductor device 100 shown in FIG. 1 are denoted by the same reference signs, and the detailed explanation thereof will be omitted.

In the power semiconductor device 300, the shape of the cooling fin 3 is different from the shape of the cooling fin 3 of the power semiconductor device 100. In other words, the cooling fin 3 in the power semiconductor device 300 is constituted by rectangular (plate-like) fins 3b having gaps 3c. By configuring the cooling fin 3 in this manner, the refrigerant can also flow through the gaps 3c. Therefore, the contact area of the refrigerant for the rectangular fins 3b becomes large, and thus the heat dissipation efficiency by the cooling fin 3 can be further improved.

[Fourth Embodiment]

Figure 12:
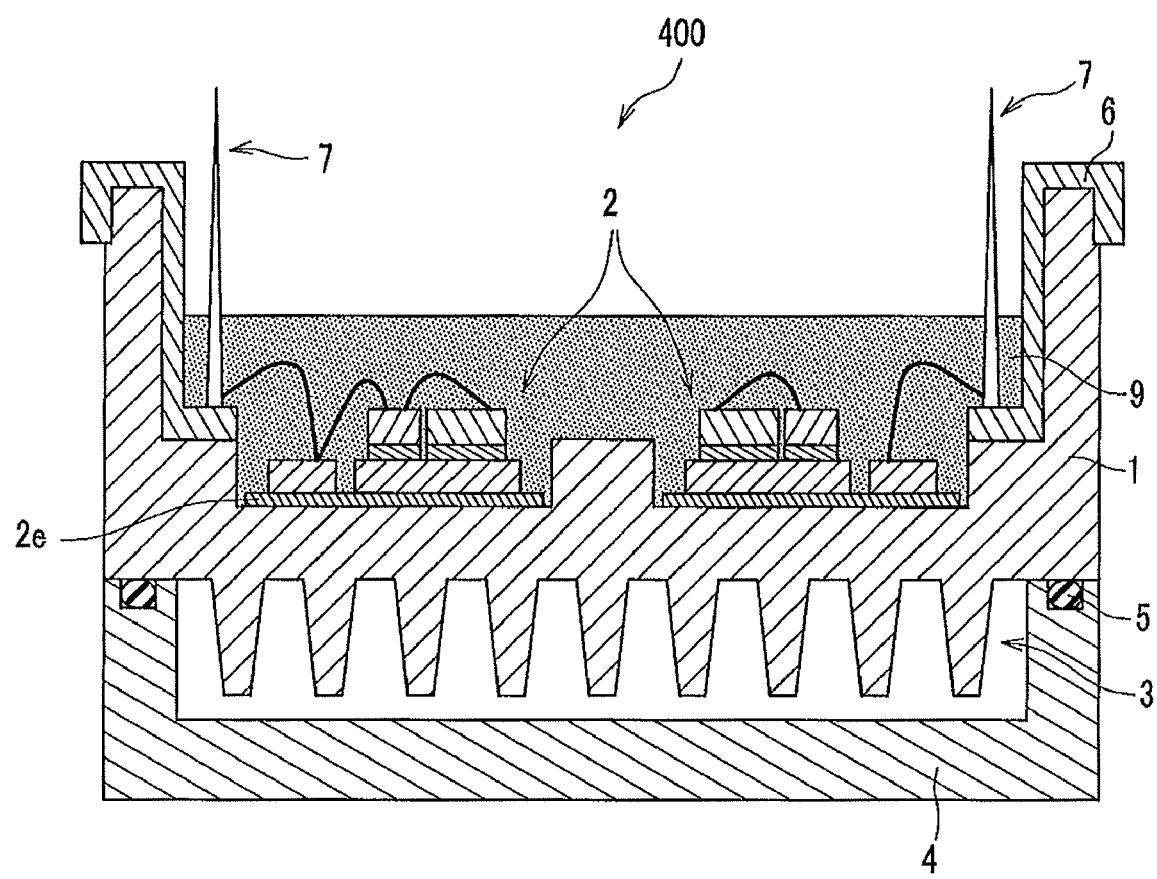
FIG. 12 is a cross-sectional view of a power semiconductor device 400 according to a fourth embodiment of the present invention.

A power semiconductor device 400 according to a fourth embodiment will be explained with reference to FIG. 12. The same members as those of the power semiconductor device 100 shown in FIG. 1 are denoted by the same reference signs, and the detailed explanation thereof will be omitted.

In the power semiconductor device 400, the substrate bottom surface conductive layer 10 and the under substrate solder 11 provided on the power semiconductor device 100 are removed. In other words, the insulating substrate 2e is directly secured to the bottom surface 1A without solder.

Securing the insulating substrate 2e to the base 1 is carried out by the molten metal bonding method. More specifically, the base 1 is formed by forging, and by contacting the insulating substrate 2e with the base 1 in the middle of cooling (before aluminum is completely solidified) after forging, the insulating substrate 2e can be secured to the base 1. At this time, an alloy layer is formed at the interface between the base 1 and the insulating substrate 2e, so that the insulating substrate 2e is directly secured to the base 1.

With this configuration, the substrate bottom surface conductive layer 10 and the under substrate solder 11 are not required to be provided. For this reason, the heat of the semiconductor circuit 2 can be efficiently transferred to the cooling fin 3 because the thermal resistance is smaller than that of the power semiconductor device 100. In addition, there is an advantage that the above fatigue of the solder is not a problem because the under substrate solder 11 is not provided.

[Modification Example]

In addition to the four embodiments described above, the embodiments can be implemented with appropriate modifications within a range not to impair the spirit of the present invention.

For example, although the edge portion 1a and the protruding portion 1b are provided in each of the above embodiments, only the protruding portion 1b can be provided without the edge portion 1a. Furthermore, only the edge portion 1a can be provided without the protruding portion 1b. In this case, the edge portion 1a corresponds to the "protruding portion" specified in claims.

The location of the protruding portion 1b is not particularly limited, and may be anywhere. However, it is preferable to provide the protruding portion so as to bridge the opposing edges of the base in view of maximizing the effect of the present invention. In the case of the rectangular base, for example, the protruding portion can be provided so as to bridge the opposing corners among four corners.

The height of the protruding portion 1b can be higher than the height of the edge portion 1a. The number of the protruding portion 1b is not limited to one, and may be plural. With the above configurations, the effect of the present invention can be also achieved.

The material constituting the base 1 is not limited to single aluminum, and may be any material containing aluminum such as aluminum alloy, insulator coated with aluminum, and the like.

The configuration of the cooling fin 3 is not limited to the above embodiments, and the cooling fin 3 may be in any shape as long as the heat dissipation is efficiently carried out.

When pin fins are used as the cooling fin 3 (for example, First Embodiment), the arrangement of the pin fins 3a is not particularly limited. Taking into account the suitable shortest distance "L", the pin fins 3a may be appropriately designed and arranged.

The configuration of the semiconductor circuit 2 is not limited to the above embodiments, and any semiconductor circuit may be similarly applied. Also, the number of the electrodes 7 may be arbitrarily set.

The kind of the seal member 5 is not limited to the O-ring, and the seal member 5 may be appropriately changed to a packing or the like.

The gel which seals the semiconductor circuit 2 is not limited to the silicone gel 9, and any insulating gel may be used.

REFERENCE SIGNS LIST

1: base
1a: edge portion (protruding portion)
1b: protruding portion
1c: bottom portion
2: semiconductor circuit
2a: IGBT element
2b: diode element
2c: under element solder
2d: substrate top surface conductive layer
2e: insulating substrate
2f: wiring (electrical signal line)
3: cooling fin
3a: pin fin
4: cooling jacket
5: seal member
6: block (insulating member)
7: electrode (connection terminal)
9: silicone gel (gel)
10: substrate bottom surface conductive layer
11: under substrate solder
100: power semiconductor device
200: power semiconductor device
300: power semiconductor device
400: power semiconductor device

The invention claimed is:

1. A power semiconductor device, comprising
a base, semiconductor circuits which are arranged on the base, and a cooling fin which cools the semiconductor circuit, wherein
one or more protruding portions of the base protrude from a surface of the base opposite the cooling fin, and
a width of the protruding portion in a direction parallel to the base surface is longer than a thickness of the base,
the protruding portion is disposed to form at least one space, and the space is filled with a gel,
a height of the protruding portion is higher than a height of the gel,
the power semiconductor device comprises connection terminals which are connected to the semiconductor circuits through electrical signal lines, and
insulating members are disposed between the protruding portion and the connection terminals.

2. The power semiconductor device as set forth in claim 1, wherein
the cooling fin consists of a plurality of adjacent pin fins, and
a shortest distance between the plurality of adjacent pin fins constituting the cooling fin is shorter than the width of the protruding portion.

3. The power semiconductor device as set forth in claim 1, wherein a thickness of a bottom portion of the base is less than or equal to 2 millimeters.

4. The power semiconductor device as set forth in claim 1, wherein the cooling fin is arranged on one side of the base opposite to a surface on which the semiconductor circuit is arranged.

5. The power semiconductor device as set forth in claim 1, in which
the protruding portion are formed at least two, and
the semiconductor circuit is arranged between the two protruding portions.

6. The power semiconductor device as set forth in claim 1, wherein the insulating member is a member including a resin.

7. The power semiconductor device as set forth in claim 1, wherein the semiconductor circuit is secured to the base through a solder.

8. The power semiconductor device as set forth in claim 1, wherein the semiconductor circuit is directly secured to the base by forming an alloy layer at the interface.

9. The power semiconductor device as set forth in claim 1, wherein the base is a member including aluminum.

10. The power semiconductor device as set forth in claim 1, wherein a refrigerant is in contact with the cooling fin.

* * * * *